United States Patent
Higashida et al.

(10) Patent No.: US 7,036,221 B2
(45) Date of Patent: May 2, 2006

(54) METHOD OF MANUFACTURING A SEMICONDUCTOR ELEMENT-MOUNTING BOARD

(75) Inventors: Takaaki Higashida, Kadoma (JP); Koichi Kumagai, Ikoma (JP); Takahiro Matsuo, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/781,759

(22) Filed: Feb. 20, 2004

(65) Prior Publication Data
US 2004/0158979 A1 Aug. 19, 2004

Related U.S. Application Data

(60) Continuation of application No. 09/878,419, filed on Jun. 12, 2001, now abandoned, which is a division of application No. 08/890,009, filed on Jul. 8, 1997, now Pat. No. 6,265,673.

(30) Foreign Application Priority Data

Jul. 9, 1996 (JP) .................................. 8-179031

(51) Int. Cl.
 *H01K 3/22* (2006.01)
(52) U.S. Cl. ................. 29/848; 29/831; 29/841; 29/847; 174/255; 264/328.12; 361/748
(58) Field of Classification Search .............. 29/831, 29/842, 844, 846–851, 841; 174/255, 260, 174/261, 262–266; 264/145, 157, 272.11–272.17, 264/328.11–328.18, 265; 361/748, 783, 361/792; 439/66–75, 722, 736
See application file for complete search history.

(56) References Cited

U.S. PATENT DOCUMENTS

| | | | |
|---|---|---|---|
| 3,862,790 A | 1/1975 | Davies et al. .................. 439/66 |
| 4,202,007 A | 5/1980 | Dougherty et al. ........... 357/80 |
| 4,616,406 A | 10/1986 | Brown ......................... 29/856 |
| 4,778,950 A * | 10/1988 | Lee et al. ............... 174/35 GC |
| 4,916,523 A | 4/1990 | Sokolovsky ................ 174/52.1 |
| 4,926,241 A | 5/1990 | Carey .......................... 257/698 |
| 5,036,431 A | 7/1991 | Adachi et al. .............. 361/412 |
| 5,165,651 A * | 11/1992 | Welch et al. ................ 248/678 |
| 5,258,648 A | 11/1993 | Lin .............................. 257/778 |
| 5,281,771 A | 1/1994 | Swift et al. .................. 174/262 |
| 5,364,276 A * | 11/1994 | Inasaka ......................... 439/66 |
| 5,410,807 A | 5/1995 | Bross et al. .................. 29/843 |
| 5,455,456 A | 10/1995 | Newman ..................... 257/704 |
| 5,477,933 A | 12/1995 | Nguyen ...................... 174/262 |
| 5,478,972 A | 12/1995 | Mizutani et al. ............ 174/250 |

(Continued)

FOREIGN PATENT DOCUMENTS

EP 587 442 3/1994

(Continued)

*Primary Examiner*—Minh Trinh
*Assistant Examiner*—Donghai D. Nguyen
(74) *Attorney, Agent, or Firm*—Wenderoth, Lind & Ponack, L.L.P.

(57) ABSTRACT

A method of manufacturing a semiconductor mounting board includes providing a base member and linear conductive members formed of metallic wires. The conductive members are constructed so that they extend linearly between a semiconductor element-mounting face and a circuit board-mounting face of a base member, and are integrally molded within the base member. For this purpose, a resin material for forming the base member is injected into a mold wherein the conductive members are linearly arranged beforehand.

5 Claims, 14 Drawing Sheets

U.S. PATENT DOCUMENTS

| | | | |
|---|---|---|---|
| 5,483,421 A | 1/1996 | Gedney et al. | 361/771 |
| 5,517,751 A | 5/1996 | Bross et al. | 29/830 |
| 5,535,101 A | 7/1996 | Miles et al. | 367/808 |
| 5,541,567 A | 7/1996 | Fogel et al. | 336/200 |
| 5,637,176 A | 6/1997 | Gilleo et al. | 156/277 |
| 5,781,264 A | 7/1998 | Noda et al. | 349/150 |
| 5,810,607 A | 9/1998 | Shih et al. | 439/66 |
| 5,870,289 A | 2/1999 | Tokuda et al. | 361/779 |

FOREIGN PATENT DOCUMENTS

| | | | |
|---|---|---|---|
| EP | 602 328 | | 6/1994 |
| EP | 603 928 | | 6/1994 |
| JP | 361237458 A | * | 10/1986 |
| JP | 02-11375 | | 1/1990 |
| JP | 04-240759 | | 8/1992 |
| JP | 08-167630 | | 6/1996 |

* cited by examiner

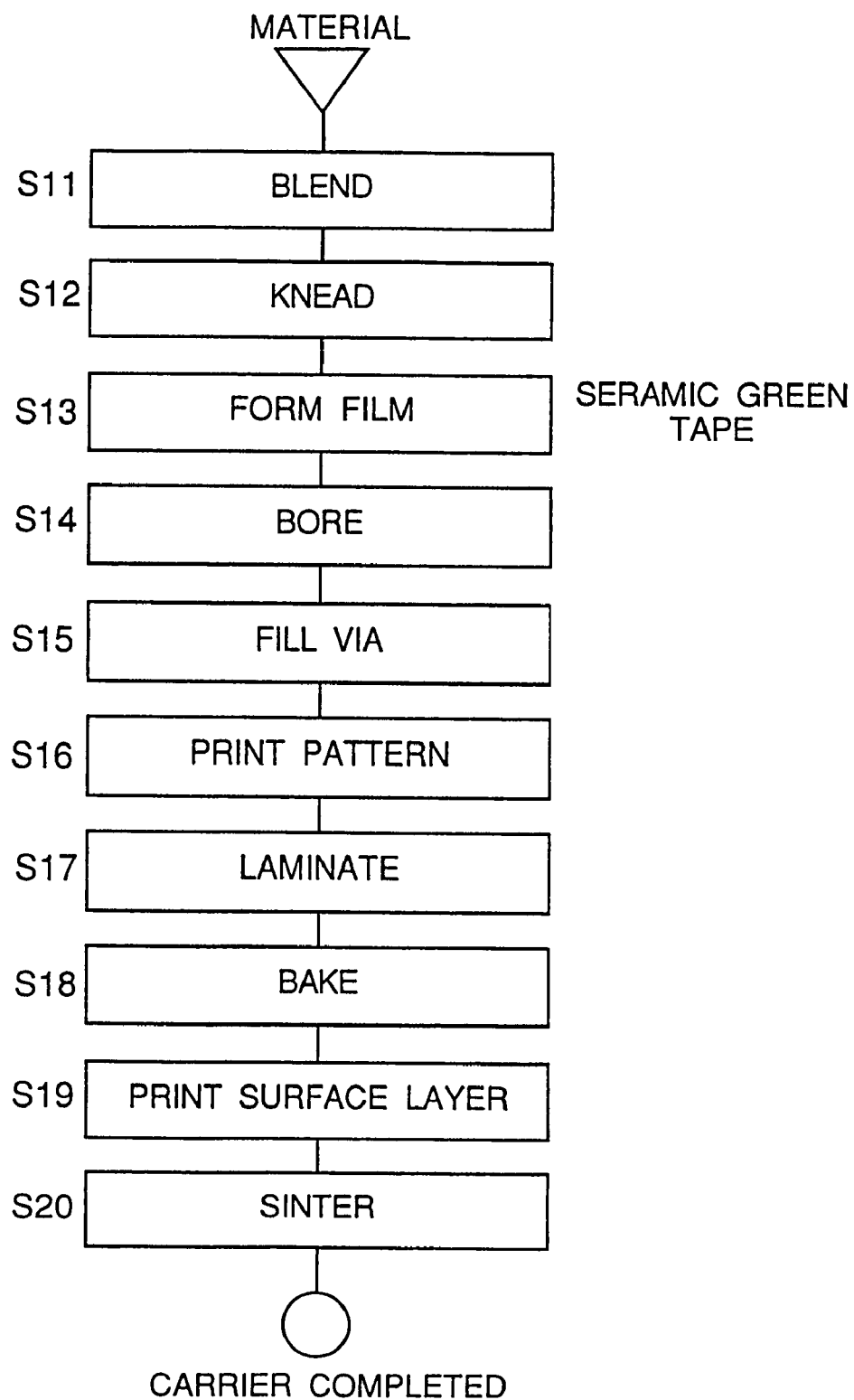

METHOD OF MANUFACTURING A SEMICONDUCTOR ELEMENT-MOUNTING BOARD

This application is a Continuation Application of Ser. No. 09/878,419 filed Jun. 12, 2001, now abandoned, which is a Divisional Application of Ser. No. 08/890,009, filed Jul. 8, 1997, now U.S. Pat. No. 6,265,673 B1.

BACKGROUND OF THE INVENTION

The present invention relates to a semiconductor element-mounting board with a semiconductor mounted thereto by a flip-chip mounting method, and a semiconductor device using the semiconductor element-mounting board.

Along with the current rapid progress changing electronic appliances to be compact and exhibit high-performance, as represented by portable phones, personal computers, pager units, etc., the number of semiconductors used in each electronic circuit has increased. Meanwhile, the electronic circuit comes to use a frequency band as high as 1 GHz, whereby not only the processing speed of an integrated circuit (IC) matters, but the wiring length of the electronic circuit also matters much. The IC is consequently being changed from a package IC to a bare IC and mounted by a flip-chip mounting method, wherein the active side of the IC faces down and the inactive side faces upward, not by a wire bonding method. In a chip size package (referred to as "CSP" hereinafter) as a typical form of the flip-chip mounting method, the semiconductor element is first mounted on a special board by the flip-chip mounting method, sealed, and then finally mounted on a printed circuit board.

A flow of procedures in the aforementioned CSP mounting method and the structure of the CSP will be described with reference to the drawings.

FIG. 21 shows the structure of the CSP. A semiconductor element-mounting board 2—called a carrier—onto which a semiconductor element 23 is to be mounted by the flip-chip mounting method is manufactured by layering a plurality of ceramic boards according to the prior art. In the board 2, the semiconductor element 23 is arranged at the side of a semiconductor element-mounting face 2a where electrodes 2c are formed, while a printed board is disposed at the side of a circuit board-mounting face 2b where bonding lands 18 are formed. An interlayer conduction part 5 is provided between layers of the semiconductor element-mounting board 2 so as to electrically connect the electrodes 2c with the bonding lands 18. Projecting electrodes 24 are formed on aluminum pads 23a of the semiconductor element 23, and are electrically connected by a conductive paste 25 with the electrodes 2c at the semiconductor element-mounting face 2a of the board 2. The semiconductor element 23 is electrically connect to the printed board in this manner. A connected part between the semiconductor element 23 and the semiconductor element-mounting board 2 is sealed by a sealant 26.

In FIG. 21, a face provided with wirings of the semiconductor element 23 faces to the board 2 and therefore this way of mounting is denoted as a flip-(inverted) chip mounting. The semiconductor element-mounting board 2 is often formed in a multi-layer structure as indicated in the drawing so as to improve a wiring density through wirings between electrodes of the layers. However, this unfortunately increases a total wiring length in the semiconductor element-mounting board 2.

The lands 18 are at the circuit board-mounting face 2b of the board 2 are formed larger in diameter than a via hole, thereby to compensate for a positional shift of the via hole. Although the bonding lands are flat in FIG. 21, metallic balls of solder or the like, or long pins are added to the lands in some cases, respectively called as a ball grid array (BGA) and a pin grid array (PGA).

FIG. 22 shows a process flow of the conventional CSP mounting. In step 1 (abbreviated as "S1" in FIG. 22), the projecting electrodes 24, i.e., bumps, are formed on the aluminum pads 23a on the active face of the semiconductor element 23. In step 2, the projecting electrodes 24 are leveled. In step 3, a required amount of the conductive paste 25 is transferred onto the projecting electrodes 24. Then, the semiconductor element 23 is inverted in step 4 and the projecting electrodes 24 with the conductive paste 25 are mounted to the electrodes 2c formed on the semiconductor element-mounting board 2 in step 5. Thereafter, in order to prevent the semiconductor element 23 from being shifted or separated from the mounting board 2, the conductive paste 25 is set up in step 6. The sealant 26 is injected between the semiconductor element 23 and the mounting board 2 in step 7. When the sealant 26 is set in step 8, the CSP is completed.

The electronic appliances these days are made compact, light-weight and thin through the above-described mounting technique.

The conventional semiconductor element-mounting board 2 has disadvantages as follows. While etching is preferred to form a fine wiring pattern to the semiconductor element-mounting face 2a and the circuit board-mounting face 2b of the board 2, a special poisonous etching solution would be needed for the etching of the board 2, because the conventional mounting board 2 is made of ceramic as mentioned earlier. As such, printing is utilized heretofore to form the wiring pattern on the surfaces of the board. In other words, the wiring pattern is difficult to make fine in order to match a pitch of the ICs. Moreover, since the bonding lands 18 larger than the via holes should be formed on the circuit board-mounting face 2b of the board 2, this makes it hard to satisfy the above fine pitch of the ICs. While the mounting board 2 is constituted of a plurality of layers and the wiring is provided between the layers in order to make up the aforementioned imperfect, not-fine wiring pattern, a conduction resistance between the layers is unfavorably increased. Through holes are also necessary to form the interlayer conduction part 5. Thus the conventional semiconductor element-mounting board 2 in a multi-layer structure with the wiring provided between the layers has a high cost and requires a long lead time, while having poor mounting reliability onto the printed board.

SUMMARY OF THE INVENTION

The present invention is devised to solve the above-described disadvantages. The object of the present invention is to provide a semiconductor element-mounting board and a semiconductor device using the board which are manufactured inexpensively, shows a low interlayer conduction resistance, fits to multi-pin ICs, has improved mounting reliability onto a printed board, increases productivity and shortens a manufacture lead time.

In accomplishing these and other aspects, according to a first aspect of the present invention, there is provided a semiconductor element-mounting board including a base member which includes a semiconductor element-mounting face to which a semiconductor element is mounted. The semiconductor element is electrically connected by a flip-chip mounting method. The base member also includes a circuit board-mounting face opposite to the semiconductor element-mounting face and which is mounted to a circuit board. The base member is formed of an electrically insulating resin material in one layer.

The semiconductor element-mounting board also includes linear conductive members, all of which are nearly orthogonal to the semiconductor element-mounting face and the circuit board-mounting face. The linear conductive members extend linearly to penetrate to an interior of the base member thereby to electrically connect the semiconductor element with the circuit board.

According to a second aspect of the present invention, there is provided a semiconductor element-mounting board according to the first aspect, wherein the conductive member is formed of a metallic wire.

According to a third aspect of the present invention, there is provided a semiconductor element-mounting board according to the first or second aspect, wherein the conductive member is formed of any one metal selected from a group consisting of Cu, Au, Al, Ag, Pd, and Pt, or an alloy mainly composed of one of the metals.

According to a fourth aspect of the present invention, there is provided a semiconductor element-mounting board according to any one of the first through third aspects, wherein the resin material is a liquid crystal polymer having a heat resistance of 250° C. or higher and a thermal expansion coefficient of 15 ppm or lower.

According to a fifth aspect of the present invention, there is provided a semiconductor element-mounting board according to any one of the first through fourth aspects, wherein the conductive member has an end face located on the same plane as the circuit board-mounting face and working as an external electrode terminal.

According to a sixth aspect of the present invention, there is provided a semiconductor element-mounting board according to any one of the first through fourth aspects, wherein the conductive member has a projecting part projecting from the circuit board-mounting face.

According to a seventh aspect of the present invention, there is provided a semiconductor element-mounting board according to the sixth aspect, wherein the project part is tapered.

According to an eighth aspect of the present invention, there is provided a method for manufacturing a semiconductor element-mounting board. The semiconductor element-mounting board comprises a base member which includes a semiconductor element-mounting face to which a semiconductor element is mounted and electrically connected by a flip-chip mounting method. The base member also includes a circuit board-mounting face opposite to the semiconductor element-mounting face and mounted to a circuit board. The base member is formed of an electrically insulating resin material in one layer. The semiconductor element-mounting board also comprises linear conductive members which are nearly (substantially) orthogonal to the semiconductor element-mounting face and the circuit board-mounting face. The linear conductive members extend linearly to penetrate to an interior of the base member thereby to electrically connect the semiconductor element with the circuit board.

The method of manufacturing the semiconductor element-mounting board described above includes initially arranging the conductive members in a mold. Then, the resin material for forming the base member is injected into the mold so that the conductive members and the resin material are integrally molded.

According to a ninth aspect of the present invention, there is provided a manufacturing method according to the eighth aspect, further comprising, after the injecting of the resin, forming a wiring to be electrically connected with the conductive members. The wiring is formed on the semiconductor element-mounting face and the circuit board-mounting face of the base member.

According to a 10th aspect of the present invention, there is provided a manufacturing method according to the ninth aspect, further comprising machining an outer face of the base member after the injecting of the resin and before the wiring-forming.

According to an 11th aspect of the present invention, there is provided a manufacturing method according to any one of the eight through 10th aspects, further comprising, after the injecting of the resin, cutting a base member block molded by injecting the resin material into the mold with the conductive member arranged therein. The base member mold is cut in a direction orthogonal to axial directions of the conductive members to thereby obtain the base members.

According to a 12th aspect of the present invention, there is provided a manufacturing method according to any one of the eight through 11th aspects, further comprising turning rough contact faces between the conductive members and the resin material to increase adhering forces therebetween before the conductive members are set in the mold for the injecting.

According to a 13th aspect of the present invention, there is provided a manufacturing method according to the 12th aspect, further comprising applying an adhesion-increasing agent to the contact faces instead of turning the faces rough.

According to a 14th aspect of the present invention, there is provided a manufacturing method according to any one of the eight through 13th aspects, wherein during the injecting, the resin material is injected to flow in the axial directions of the conductive members through at least two injection openings arranged symmetric to each other with respect to each of the conductive members.

According to a 15th aspect of the present invention, there is provided a manufacturing method according to the 14th aspect, wherein the mold has a first holding plate holding axial first ends of the conductive members and having the injection openings extending in the axial directions of the conductive members. A second holding plate holds the other ends of the conductive members and is movable in the axial direction. A pressure regulation mechanism is provided that allows the second holding plate to move in the axial direction in response to the compression/extension of the conductive members due to the injected resin material.

During the injecting in this 15th aspect, the second holding plate is moved in the axial direction in response to the compression/extension of the conductive members due to the injected resin material, thereby restricting bends in the conductive members.

According to a 16th aspect of the present invention, there is provided a manufacturing method according to any one of the eighth through 13th aspects, wherein during the injecting, the resin material flows in the axial directions of the conductive members after being injected into a vicinity of the axial first ends of the conductive members through a plurality of injection openings formed in the vicinity of the axial one ends of the conductive members supported by the mold.

According to a 17th aspect of the present invention, there is provided a method for manufacturing a semiconductor element-mounting board, the semiconductor element-mounting board comprises a semiconductor element mounted and electrically connected by a flip-chip mounting method. The base member also includes a circuit board-mounting face opposite to the semiconductor element-mounting face and mounted to a circuit board. The base member is formed of an electrically insulating resin material in one layer. The semiconductor element-mounting board also comprises linear conductive members which are nearly orthogonal to the semiconductor element-mounting face and the circuit board-mounting face. The linear conductive members extend linearly to penetrate an interior of the base member thereby to electrically connect the semiconductor element with the circuit board.

The method of manufacturing the semiconductor element-mounting board described above includes injecting the resin material into a mold so that through holes are formed to penetrate the semiconductor element-mounting face and the circuit board-mounting face to mold the base member. The method also comprises inserting the conductive members in the through holes.

According to an 18th aspect of the present invention, there is provided a manufacturing method according to the 17th aspect, further comprising, after the conductive members are inserted into the through holes, forming a wiring to the semiconductor element-mounting face, the circuit board-mounting face of the base member, and an inner wall face of one of the through holes.

According to a 19th aspect of the present invention, there is provided a manufacturing method according to the 17th or 18th aspect, further comprising, after the injecting, cutting a molded base member block provided with the through holes. The base member mold is cut in a direction orthogonal to an extending direction of the through holes to form the base member.

According to a 20th aspect of the present invention, there is provided a manufacturing method according to the eighth or 17th aspect. This method further comprises, after the injecting, forming at the conductive member a projecting part projecting from the circuit board-mounting face. The method of the 20th aspect of the present invention also comprises performing plastic treatment on the projecting part so as to form a land to be connected to the circuit board.

According to a 21st aspect of the present invention, there is provided a manufacturing method according to the 20th aspect, wherein in forming the projecting part, the method comprises leveling the base member with the conductive member so that a thickness of the base member is equal to a length of the conductive member. Thereafter, only the base member is removed in a thicknesswise direction.

According to a 22nd aspect of the present invention, there is provided a manufacturing method according to the 21st aspect, wherein the removing of the base member is conducted by any of wet etching, dry etching, sandblasting, and machining.

According to a 23rd aspect of the present invention, there is provided a manufacturing method according to the ninth or 18th aspect, wherein the wiring is obtained by forming the wiring by etching after plating a conductor on the base member, or by plating only a necessary part to be wired.

According to a 24th aspect of the present invention, there is provided a manufacturing method according to the ninth or 18th aspect, wherein the wiring is obtained by printing and heating a conductive paste on the base member.

According to a 25th aspect of the present invention, there is provided a semiconductor device which has a semiconductor element mounted on, electrically connected to, and sealed to the semiconductor element-mounting face of the semiconductor element-mounting board according to the first aspect.

According to a 26th aspect of the present invention, there is provided a semiconductor device according to the 25th aspect, wherein the semiconductor element is sealed by forming an end face of a sealant along a side face of the semiconductor element-mounting board which is nearly parallel to a thicknesswise direction of the semiconductor element-mounting board.

According to a 27th aspect of the present invention, there is provided a method for manufacturing a semiconductor device. This method comprises mounting and electrically connecting a plurality of semiconductor elements to the semiconductor element-mounting face, of the semiconductor element-mounting board according to the first aspect. The plurality of mounted semiconductor elements is simultaneously sealed by sealing resin. Finally, the semiconductor element-mounting board and the sealing resin is cut between the semiconductor elements.

BRIEF DESCRIPTION OF THE DRAWINGS

These and other aspects and features of the present invention will become clear from the following description taken in conjunction with the preferred embodiments thereof with reference to the accompanying drawings, in which:

FIG. 23 is a flow chart of a conventional method for manufacturing a semiconductor element-mounting board.

DETAILED DESCRIPTION OF THE PREFERRED EMBODIMENTS

Figure 1:
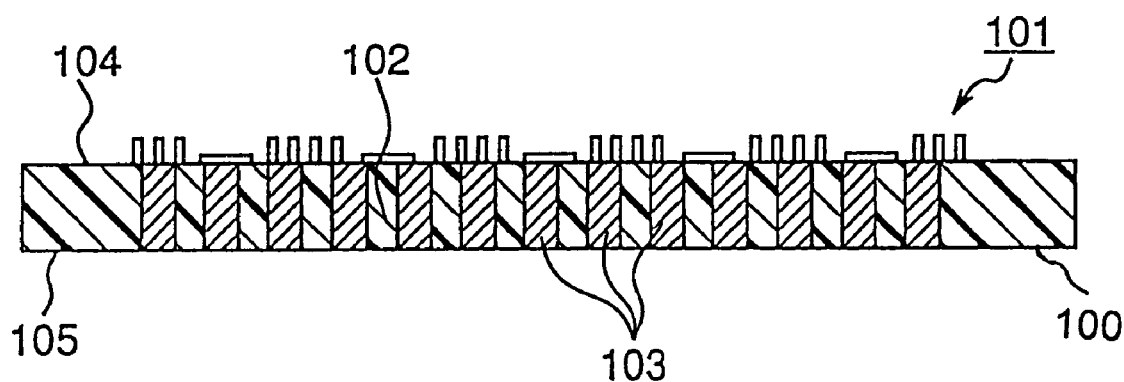
FIG. 1 is a sectional view showing the structure of a semiconductor element-mounting board in an embodiment of the present invention.

Before the description of the present invention proceeds, it is to be noted that like parts are designated by like reference numerals throughout the accompanying drawings.

A semiconductor element-mounting board, a manufacturing method for the semiconductor element-mounting board, a semiconductor device using the semiconductor element-mounting board, and a manufacturing method for the semiconductor device of an embodiment of the present invention will be described with reference to the drawings in which the same parts or functionally equal parts are designated by the same reference numerals.

First, the semiconductor element-mounting board will be described.

Figure 21:
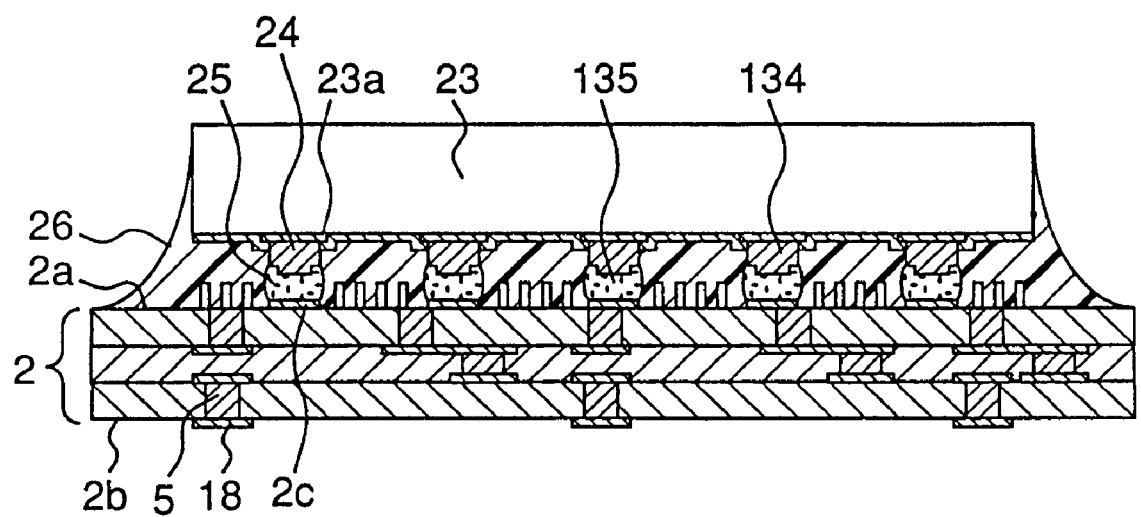
FIG. 21 is a sectional view of the structure of a conventional semiconductor device.
Figure 22:
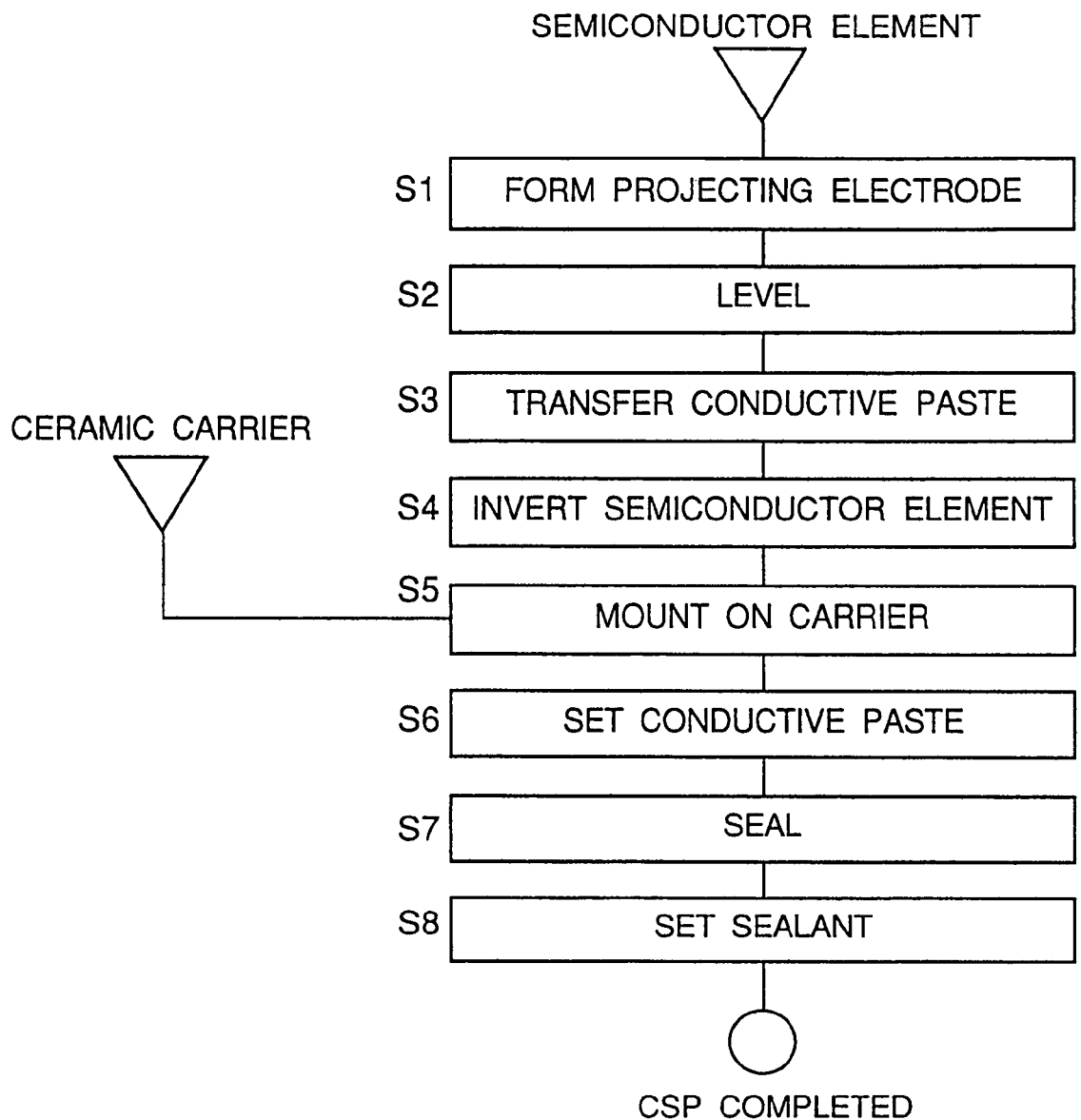
FIG. 22 is a flow chart of a conventional manufacturing method for the semiconductor device.

A semiconductor element-mounting board 101 shown in FIG. 1 is generally called a carrier and corresponds to the semiconductor element-mounting board 2 described with reference to FIG. 21. Roughly speaking, the board 101 comprises a base member 100 including resin material 102 and linear conductive members 103. In the board 101, a semiconductor element is to be mounted and electrically connected at a semiconductor element-mounting face 104 by a flip-chip mounting method, and a circuit board is to be mounted and electrically connected at a circuit board mounting face 105 of the base member 100 opposite to the mounting face 104.

Each of the linear conductive members 103 is nearly orthogonal to the mounting faces 104 and 105 of the base member 100. At the same time, each of the linear conductive members 103 extends linearly to penetrate the resin material 102 of base member 100. The conductive members 103 are formed so as to not touch each other in the base member 100. Each layer conductive member 103 is an interlayer conduction part for transmitting electric signals between the mounting faces 104 and 105, corresponding to the conventional via hole or through hole A metallic wire of a material selected from Cu, Au, Al, Ag, Pd and Pt or an alloy wire including at least one of the above metals can be used for the conductive member 103. Particularly a conductive member 103 of Au is preferred because of availability, stable quality without oxidation or the like quality change and a low resistance for use in narrow-pitch and multi-pin ICS.

Each conductive member 103 is formed of the metallic wire of, e.g., 0.1–0.15 mm diameter and arranged with, e.g., 0.3 mm pitch along, for instance, peripheral edge parts of the mounting faces 104 and 105 of the base member 100.

In one embodiment, the base member 100 is formed of a resin material 102 in one layer. The resin material should have such specific properties as good fluidity, 250° C. or higher heat resistance and 15 ppm or lower thermal expansion coefficient, while also allowing plating on to the mounting faces 104 and 105. Although any of thermosetting and thermoplastic resins can be used as the resin material, the thermosetting resin is preferable for its low viscosity from the viewpoint of adhesion to the conductive member 103 and injection convenience between the linear conductive members 103. However, a thermoplastic resin such as liquid crystal polymer, etc. may be used as well.

Although described later in detail, the semiconductor element-mounting board 101 in the above structure is obtained by locating the linear conductive members 103 in molds, and injecting the resin material which forms the base member 100 into the molds. In contrast to the conventional semiconductor element-mounting board 2, the base member 100 with the conductive members 103 can be formed in one piece in the present semiconductor element-mounting board 101. Therefore, the board 101 can be obtained in a simplified process at low cost. A manufacture lead time is shortened and productivity is improved. The semiconductor element-mounting board 101 does not create a filling failure which is generated when the conductive paste is filled in the interlayer conduction part 5 in the prior art. It also does not create a malfunction even after experiencing 1000 times or more thermal shock tests at −55° C. to 125° C. The semiconductor element-mounting board 101 shows improved reliability to disconnection, etc. Furthermore, each of the linear conductive members 103 of the mounting board 101 extends linearly through the resin 102 of base member 100 between the mounting faces 104 and 105. Therefore, conduction resistance is decreased so as to be no larger than 1 mΩ if a metallic wire of a low intrinsic volume resistivity is used for the conductive member 103. The use of the metallic wire for the conductive member 103 helps to prevent disconnections and can improve reliability and resistance to breakdown.

An arrangement interval of the linear conductive members 103 can be reduced in the mounting board 101 of this embodiment as compared with that of the interlayer conduction parts 5 of the conventional mounting board 2. The reason for this will be discussed below.

Figure 2:
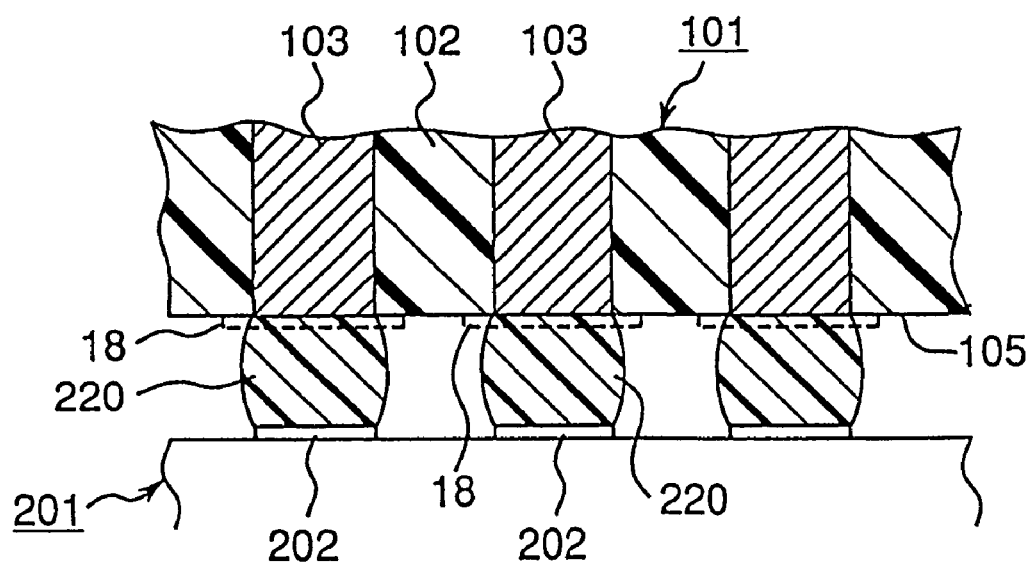
FIG. 2 is a sectional view of an example of the constitution at electrically connected parts between conductive members of the semiconductor element-mounting board and a circuit board of FIG. 1.

The lands 18 are formed at the mounting face 2b of the conventional mounting board 2, as indicated by dotted lines in FIG. 2. Each land 18 is required to be larger in diameter than the interlayer conduction part 5 formed in the conventional board 2. In other words, the interval of the interlayer conduction parts 5 is dependent on the diameter of each land 18 and therefore is set larger than required. Meanwhile, the linear conductive members 103 of the metallic wire are arranged beforehand in forming the mounting board 101 of the present invention. Thus, the unavoidable necessity in the prior art of boring the base member and burying the conductive members in the bored holes is eliminated. At the same time, in the mounting board 101 of the embodiment, the wiring is attained by etching of the mounting face 105 which will be described later, so that the necessity for forming lands at the mounting faces 105 is eliminated. The interval of the linear conductive members 103 is accordingly not dependent on the diameter of the land. Consequently, the interval of the linear conductive members 103 can be reduced, and the mounting board 101 becomes fit to narrow-pitch, multi-pin ICS.

Figure 3:
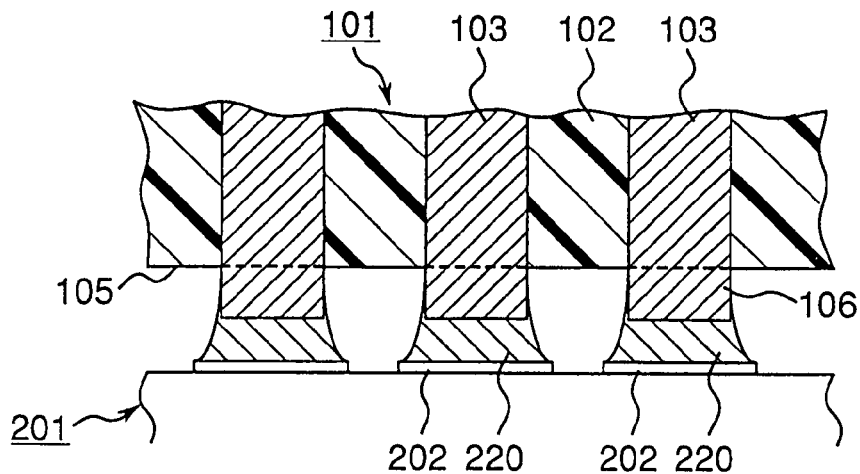
FIG. 3 is a sectional view of a different example of the constitution at electrically connected parts between conductive members of the semiconductor element-mounting board and a circuit board of FIG. 1.

As shown in FIG. 3, each linear conductive member 103 may be projected beyond the mounting face 105 of the mounting board 101 of this embodiment towards a circuit board 201 so as to constitute a projecting part 106. The projecting part 106 functions as an external electrode terminal. Due to the projecting part 106, a bonding material 220, which is generally solder used for electrically connecting the conductive member 103 with a land 202 on the circuit board 201, wets and spreads on the projecting part 106 and is sucked to the side of the board 101 via the projecting part 106. The provision of the projecting parts 106 allows the bonding material 220 in a melting state to generate a meniscus between the projecting part 106 and a respective land 202 on the circuit board 201. Therefore, even when the conductive members 103 are arranged, for instance, every 0.3 mm distance in the board 202, a failure such as a bridge or the like is prevented from being generated between the adjacent lands 202 of the circuit board 201. Accordingly, the mounting boards 101 is applicable to multi-pin semiconductor elements.

Figure 4:
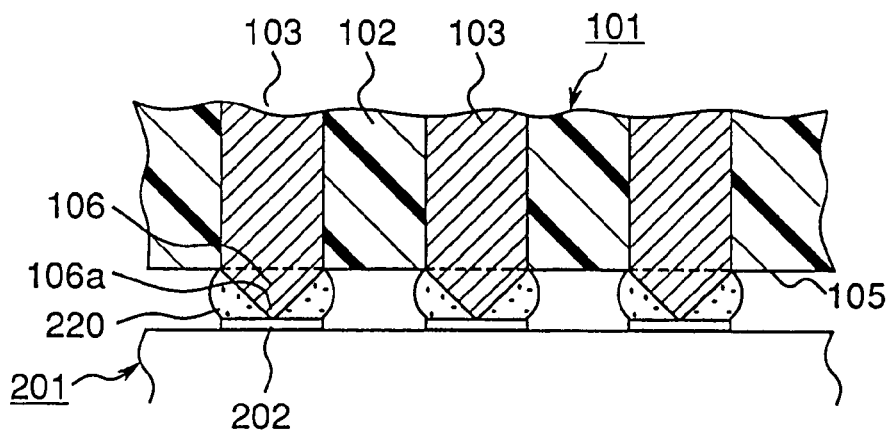
FIG. 4 is a sectional view of a further different example of the constitution at electrically connected parts between conductive members of the semiconductor element-mounting board and a circuit board of FIG. 1.

The above projecting part 106 may be tapered to, for example, a conical shape towards the circuit board 201, as in FIG. 4. The conical shape reduces a contact area between the projecting part 106 and land 202. As a result, the friction force between the projecting part 106 and land 202 is reduced, whereby a surface tension is applied from the molten solder 220 to the projecting part 106, enabling the projecting part 106 to easily slide on the land 202. A front end part 106a of the projecting part 106 is therefore positioned at a central part of the land 202 due to a self alignment effect. A positional shift of the mounting board with respect to the lands 202 spaced every 0.5 mm can be prevented even when the semiconductor element is mounted to the circuit board 201 with a mounting positional accuracy of ±0.1 mm.

Figure 5:
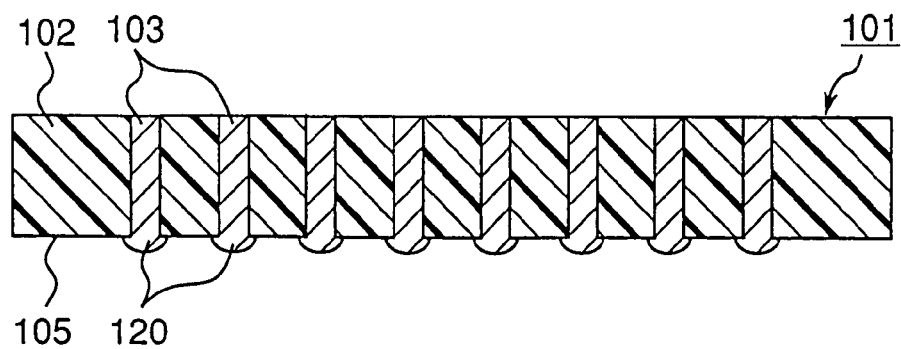
FIG. 5 is a sectional view showing the structure of a semiconductor element-mounting board in a different embodiment of the present invention.
Figure 6A:
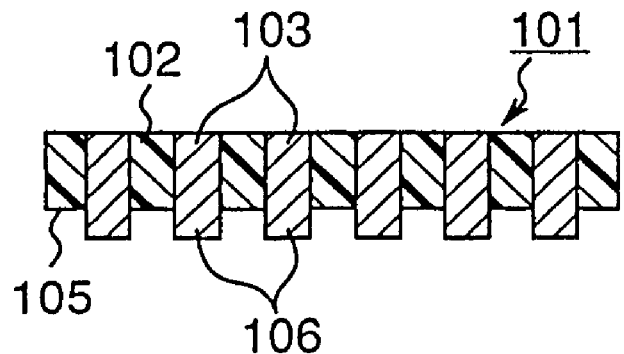
FIGS. 6A, 6B, and 6C are diagrams showing steps of a method for forming bonding lands in the semiconductor element-mounting board of FIG. 5.

The above projecting part 106 may be formed in a semicircular sectional shape as indicated in FIG. 5 to work as a bonding land 120 to be electrically connected to the wiring on the circuit board 201. The bonding land 120 is obtained as shown in the sequence of steps of FIGS. 6A–6C.

Figure 6B:
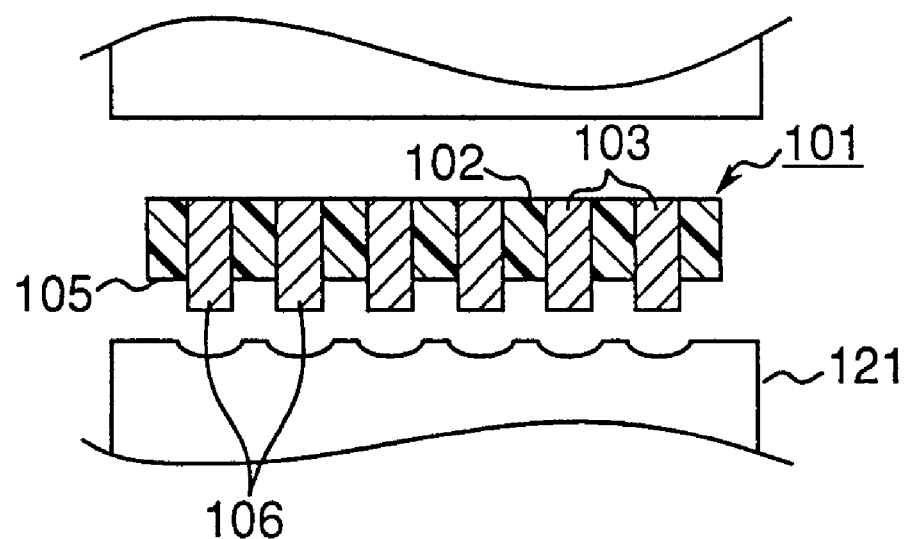
Figure 6C:
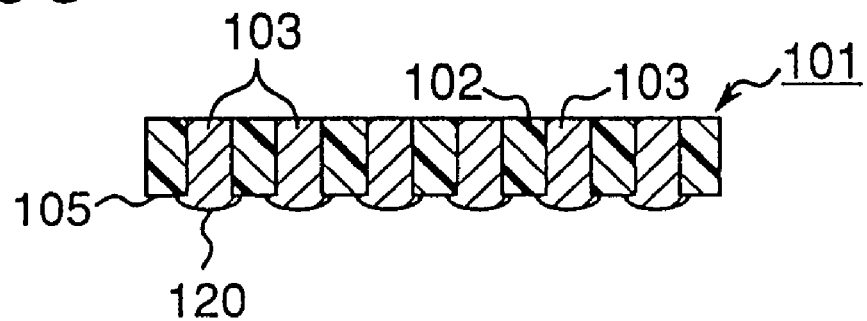

The projecting parts 106 are formed first as described above. In FIG. 6B, the projecting parts 106 are arranged in a mold 121 designed to shape the projecting parts 106 in a required form. That is, an upper mold unit of the mold 121 has a flat surface capable of coming into contact with the surface opposite to the mounting face 105, and a lower mold unit of the mold 121 has hemispherical (concave) recesses on its surface. A pressure is applied from above and below by the mold 121, thereby changing the projecting parts 106 into the shapes of the recesses in the lower mold unit of the mold. Thus, the bonding lands 120 are molded.

The bonding land 120 is larger in diameter than the linear conductive member 103. Thus, the conductive member 103 is prevented from being separated from the mounting board 101 because of shocks, etc. Experiments show that the shape of the solder used when the mounting board 101 is mounted to the circuit board 201 is changed depending on the shape of the bonding land 120 formed at the mounting board 101. A sufficient bonding strength can be secured between the mounting board 101 and the circuit board 201 if the bonding land 120 is processed into the required shape. Since many bonding lands 120 of the required shape are obtained at one time in the process, the manufacture lead time can be shortened. The semispherical front end of the conductive member 103 changes moderately to the mounting face 105 so that the concentration of stress resulting from a thermal expansion difference or the like is eliminated. Thus, reliability is enhanced.

The projecting parts 106 may be formed by projecting the conductive members 103 to the side of the circuit board 201 over the mounting face 105 in the above-described example. Alternatively, the projecting parts 106 can be obtained by removing the base member 102 at the side of the mounting face 105 thereby to project the conductive members 103, which will be depicted below.

Specifically, as shown in FIG. 2, the mounting board 101 is molded so that the circuit board mounting face 105 of the base member is even with the end faces of the linear conductive members 103. Thereafter, the base member 102 is removed to be a predetermined thickness, e.g., by dry etching sandblasting, buffing or with the use of a strong alkali solution, etc. The removing method is different for the resin material 102 used in the base member 100. For instance, when an epoxy resin is used in the base member 100, reacting ion etching (RIE) is selected. Only the resin material 102 is dry-etched using $Cl_2$ as an atmospheric gas by 50 scm at 30 mTorr and 300 W output.

Since it is possible to remove the resin material 102 alone in the above method, the projecting parts 106 can be formed in the mounting board 101 after the base member 100 is formed and cut to be a predetermined size. Even if the mounting board 101 does not have a required bonding strength as it is, the required strength can be obtained by the process of shaping the bonding lands as described above in the mounting board 101.

A manufacturing method for the above semiconductor element-mounting board 101 will now be described.

Figure 7:
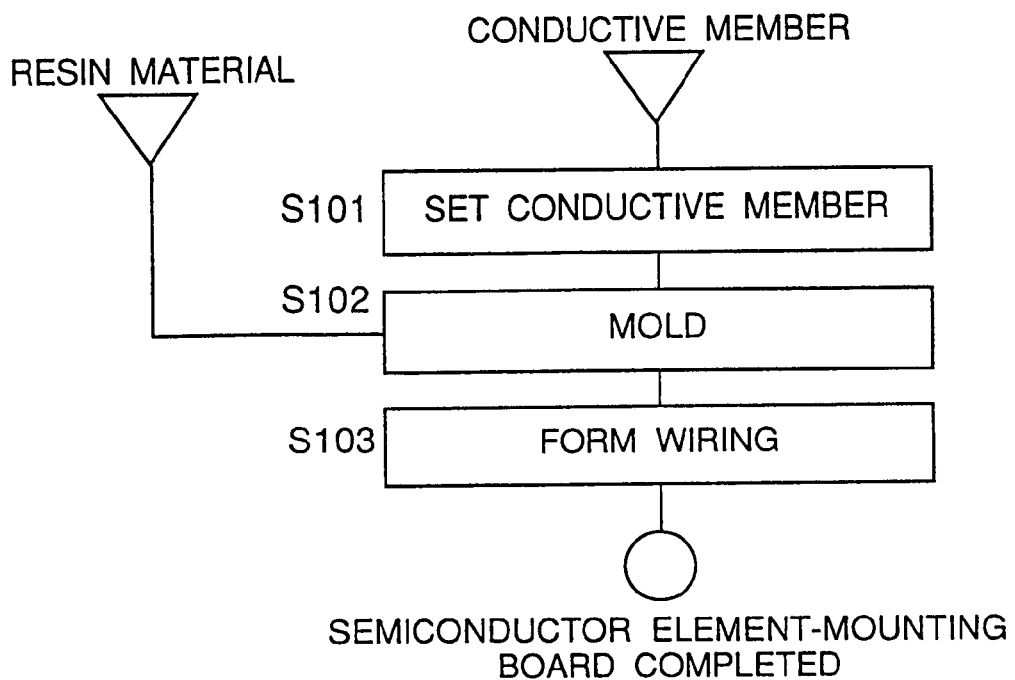
FIG. 7 is a flow chart of an example of a manufacturing method for the semiconductor element-mounting board of FIG. 1.

In step 101 in FIG. 7, the linear conductive members 103 are arranged in the mold to form a conduction part between the mounting faces 104 and 105. This process corresponds to step 14 of FIG. 23 related to the manufacture of the conventional semiconductor element-mounting board 2, i.e., forming of holes by punching a ceramic green tape.

In this embodiment, 65 grid-like conductive members 103 are formed at one time. In step 102, the resin material 102 is injected into the mold so as to form the base member 100. At this time, the resin material is also filled in between the conductive members 103. After the semiconductor element-mounting board 101 is molded in this manner, the wiring is formed on the mounting faces 104 and 105 of the base member 100 101 in step 103.

As is clear in comparison between FIGS. 7 and 23, the manufacturing process of the mounting board 101 in the embodiment can be considerably simplified, whereby the mounting board 101 can be manufactured at low costs.

Figure 8:
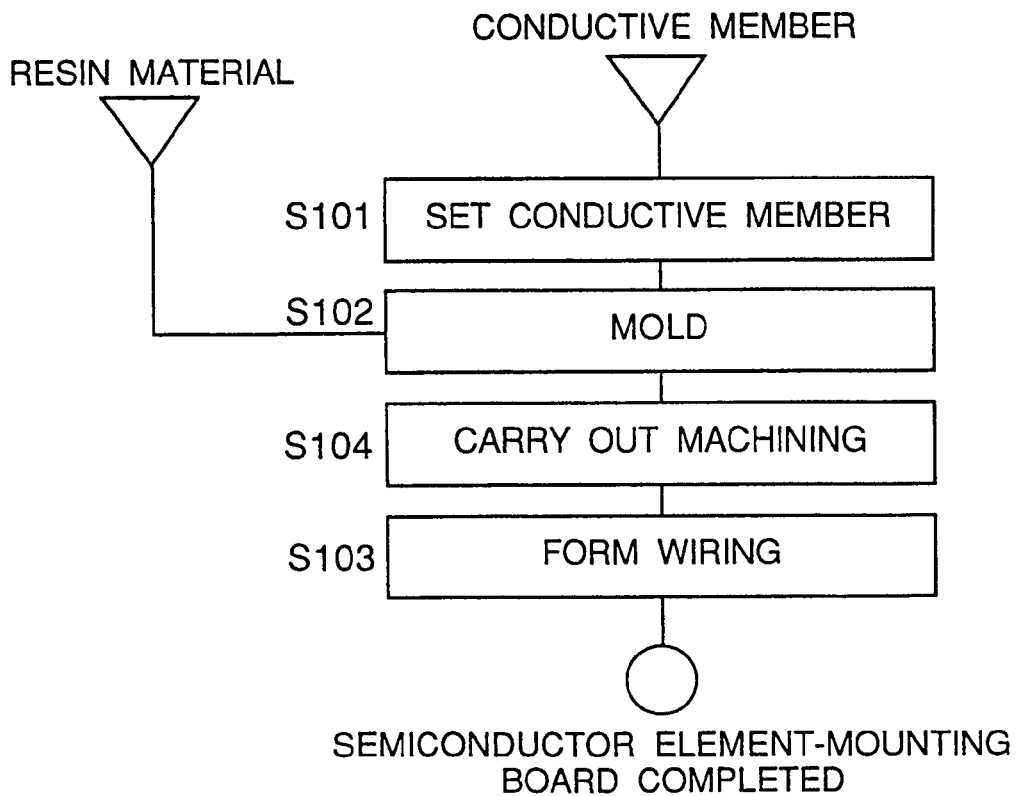
FIG. 8 is a flow chart of another example of the manufacturing method for the semiconductor element-mounting board of FIG. 1.
Figure 9:
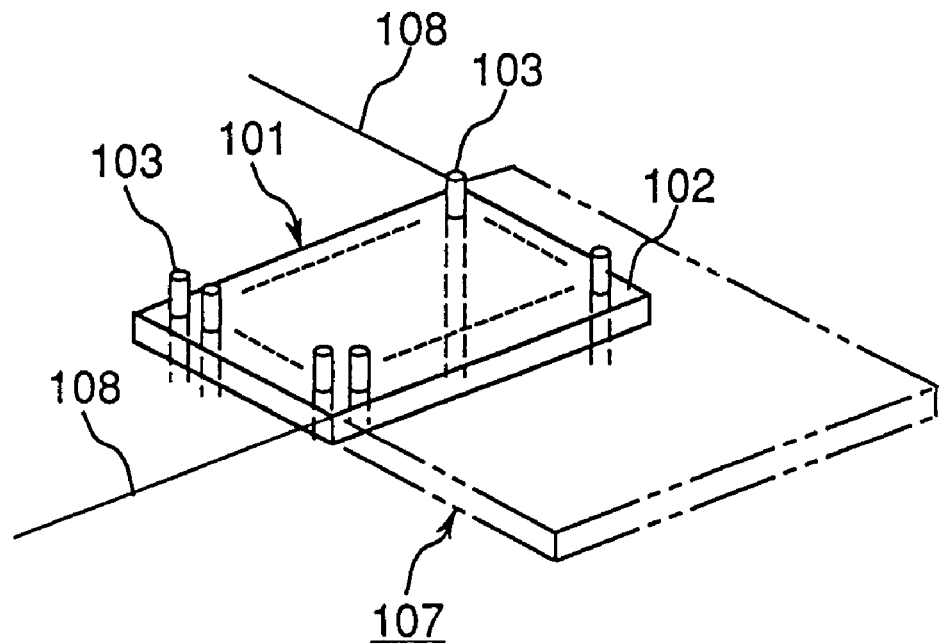
FIG. 9 is a perspective view of the semiconductor element-mounting board, explaining an example of the manufacturing method for the semiconductor element-mounting board of FIG. 1.

A step 104 is preferably added between the steps 102 and 103, as indicated in FIG. 8, to machine the molded semiconductor element-mounting board. The machining in step 104 is, for example, cutting of the mounting board to a predetermined size. More specifically, a base member block 107 represented by chain double-dashed lines in FIG. 9 and formed through steps 101 and 102 is cut along a cutting line 108. Therefore, the shape of the mounting board 101 can be determined without any limitation to the type of mold used. According to this embodiment, after the base member block 107 is formed by the 17×12 mm mold, the block is machined to 15×6 mm rectangles in step 104, to which the wiring is provided on the mounting faces 104 and 105 in step 103.

Figure 10:
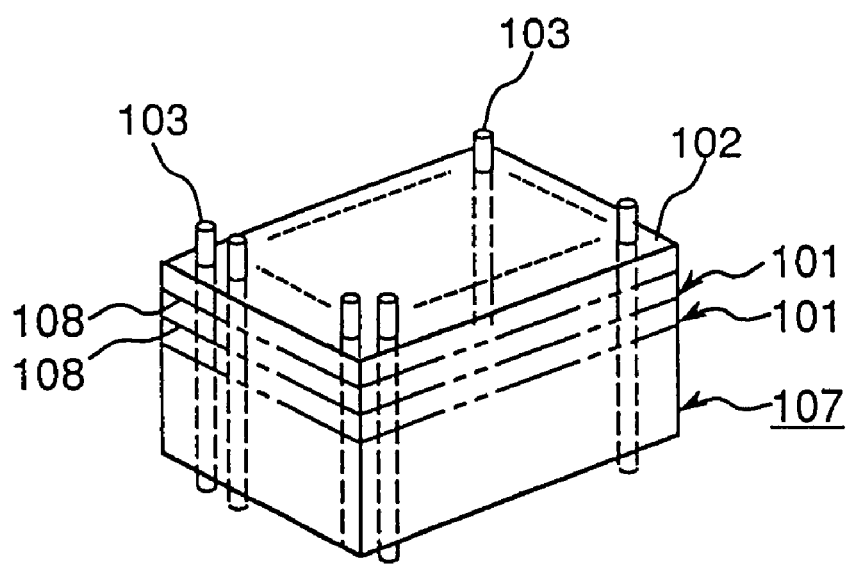
FIG. 10 is a perspective view of the semiconductor element-mounting board, showing a different example of the manufacturing method for the semiconductor element-mounting board of FIG. 1.

Alternatively, as shown in FIG. 10, when the base member block 107 is formed, the base member block 107 can be cut to layers along cutting lines 108. In this case, conductive members 103 are exposed on the mounting faces 104 and 105 of the cut mounting board 101. Cutting by a wire or a metal slitting saw, etc. is considered for the above cutting method, but grinding is preferable in terms of accuracy at cutting faces and productivity. In this embodiment, the base member block 107 is cut by rotating a blade with abrasive grains of artificial diamond at 8000 rpm. After the base member block 107 is cut to a predetermined thickness, the wiring is formed at necessary part of the mounting faces 104 and 105 of the mounting board 101 as mentioned before. Although a plurality of semiconductor element-mounting boards 101 are cut out from the base member block 107 in the above description and FIG. 10, one sheet of the mounting board 101 may also be obtained from the base member block 107.

As described hereinabove, a plurality of semiconductor element-mounting boards 101 can be continuously manufactured from one base member block 107 simply by the addition of the cutting process to the base member block 107 which is produced in a simplified manner as compared with the prior art. Therefore, the manufacturing method of this embodiment shortens the manufacture lead time and minimizes costs.

Now, the semiconductor element-mounting board 101 having improved tight contact and adhesive properties of the linear conductive members 103 to the resin material constituting the base member 102 will be described below.

In many cases, circuits formed on a circuit-forming face of the semiconductor element are of silicon or aluminum vapor-deposited film, and are considerably weak to water and ions, etc. Therefore, the semiconductor element is generally sealed when mounted. In this case, if the linear conductive members 103 are poorly adhesive to the resin material 102 in the mounting board 101, water invades through an interface between them and the board fails in a reliability test, specifically, the pressure cooker test (PCT). A bonding layer becomes consequently necessary to keep the conductive members 103 fully in tight contact with the resin material.

Figure 11:
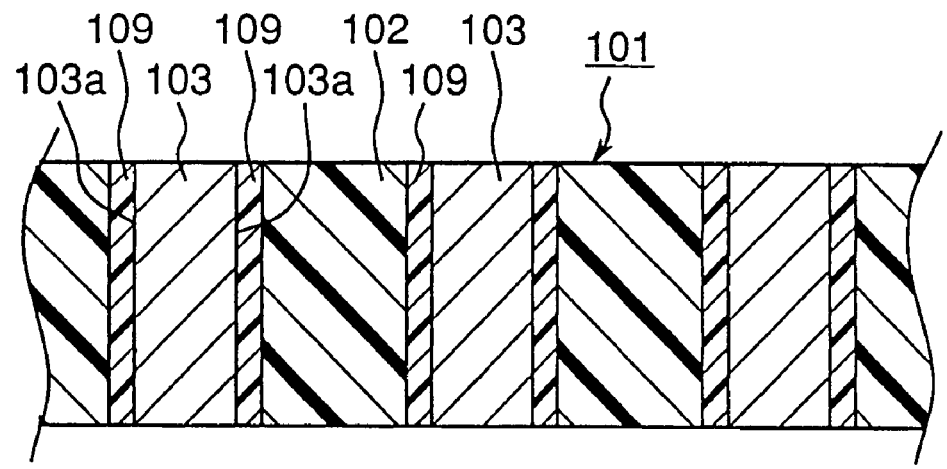
FIG. 11 is a sectional view when an adhesion-increasing agent is provided between the conductive members and the base member of the semiconductor element-mounting board of FIG. 1.

In this embodiment, an adhesion-increasing agent 109 is applied to surface 103a of the conductive members 103 which contacts the resin material, as shown in FIG. 11. The presence of the adhesion-increasing agent 109 improves the contacting and adhering properties of the contact surfaces 103 and base member 100, so that the invasion of water and ions to the contact faces 103a can be prevented. The adhesion-increasing agent 109 used is the semiconductor sealant resin in this embodiment.

After the adhesion-increasing agent 109 is applied to the linear conductive members 103, the semiconductor element-mounting board 101 is subjected to a reliability test, the results of which is shown in Table 1.

TABLE 1

| PCT: 121°, 2 atm, 300 hours later | |
|---|---|
| Board Without Agent | Board With Agent |
| Disconnected 25 hours later | Disconnection not generated |

As is clear from Table 1, a disconnection is not caused because the adhesion-increasing agent 109 is applied to the linear conductive members 103. The reliability of the mounting board 101 is thus improved.

The adhesion-increasing agent 109 is not limited to the above-mentioned semiconductor sealant resin, and any material can be used so long as it improves the adhesive and tight contact, properties between the conductive member 103 and the resin material 102.

In order to improve the contacting and adhesive properties between the conductive members 103 and resin material 102, the contact faces of the linear conductive members 103 to the resin material 102 may be processed to be rough, instead of applying the adhesion-increasing agent 109.

Next, the step 103, how to form the wiring in the mounting board 101 will be detailed.

Figure 12:
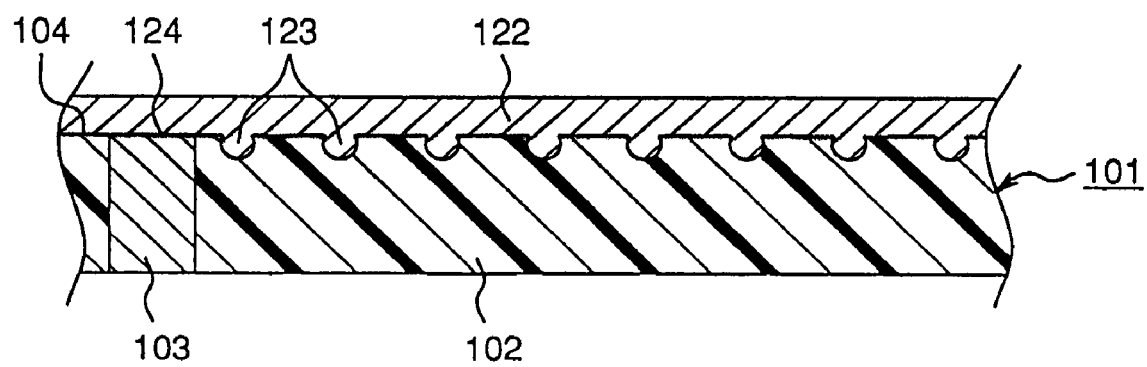
FIG. 12 is a sectional view of the semiconductor element-mounting board having a conductive film formed to provide the semiconductor element-mounting board of FIGS. 1 and 5 with a wiring.

FIG. 12 is a sectional diagram of the semiconductor element-mounting face 104 of the mounting board 101. As shown in FIG. 12, a conductive film 122 is formed on the mounting face 104. The resin material 102 for the base member 100 of the mounting board 101 is LCP Sumika Super E6510P produced by Sumitomo Chemical Company, Limited, and the conductive film 122 is plated to the mounting face 104 through an acid/alkali process. As a result of the plating, minute recesses 123 are formed in the mounting face 104 of the base member 100 of the mounting board 101 as shown in FIG. 12. The adhesion can be secured between the conductive film 122 and base member 100 due to an anchor effect of conductors deposited in the recesses 123. Moreover, a metallic bond is generated at an interface 124 between the conductive film 122 and each linear conductive member 103, thus bonding the conductive film 122 and linear conductive member 103 strongly.

The wiring may be formed by etching this conductive film 122. Alternatively, the conductive film 122 is plated only to a part to be wired.

Figure 13:
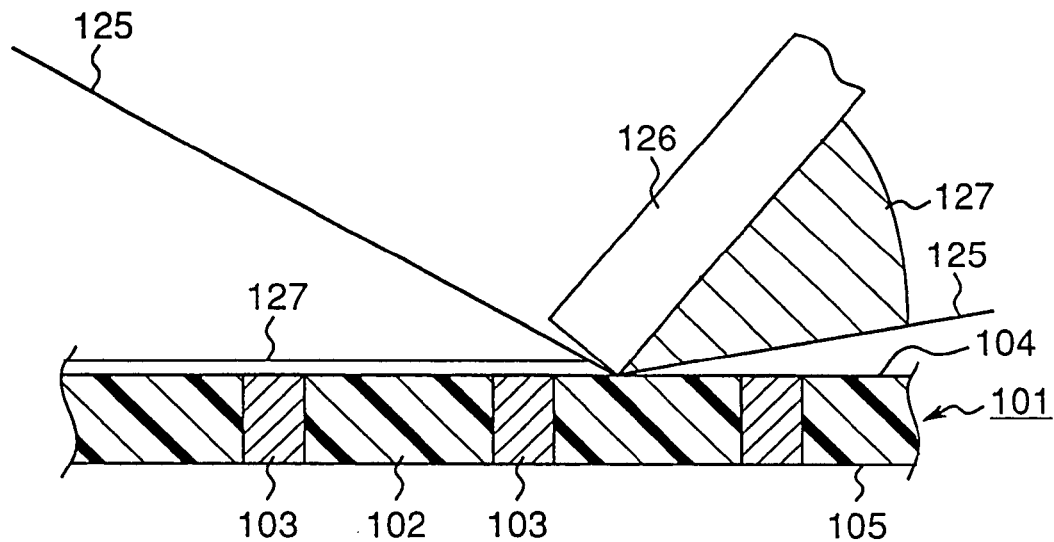
FIG. 13 is a diagram showing how the semiconductor element-mounting board of FIGS. 1 and 5 is provided with the wiring.

In an example of FIG. 13, the wiring is obtained by printing of a conductive paste. Reference numerals in FIG. 13 are: 125 a mask; 126 a squeegee; and 127 a conductive paste. The conductive paste 127 in this embodiment is obtained by dispersing copper particles in an epoxy resin. The resin material of the conductive paste 127 is LCP XYDAR G330 produced by Nihon Sekiyu Kagaku Kabushiki Kaisha After the wiring is formed on the mounting faces 104 and 105 by printing as shown in FIG. 13, the resin material of the conductive paste 127 is heated and set, thereby completing the wiring process. Although a proper viscosity of the resin material of the conductive paste 127 differs depending on a wiring pitch, if the viscosity is adjusted to be a required value, defects such as oozing or short circuits, etc. can be avoided. The wiring obtained in this method is free from defects. Even resin materials of non-plating grade can, display an adhesion strength in the wiring. While the conductive paste 127 used in the embodiment has copper particles dispersed in the epoxy resin, a sintered paste using individual dispersion superfine particles produced by Shinku Yakin Kabushiki Kaisha may also be used, in which case the same effects can be achieved.

According to the above wiring method using the conductive paste 127, it is possible to form conductors in the base member 100 even if the conductive film 122 unable to be plated. Therefore, any resin material with required characteristics is selectable for the base member 100 irrespective of whether or not the conductive film 122 can be plated to the resin material. The method enables a wide variety of semiconductor elements to be mounted onto the mounting board.

The mold for molding the above semiconductor element-mounting board 101 will be described next.

Figure 14:
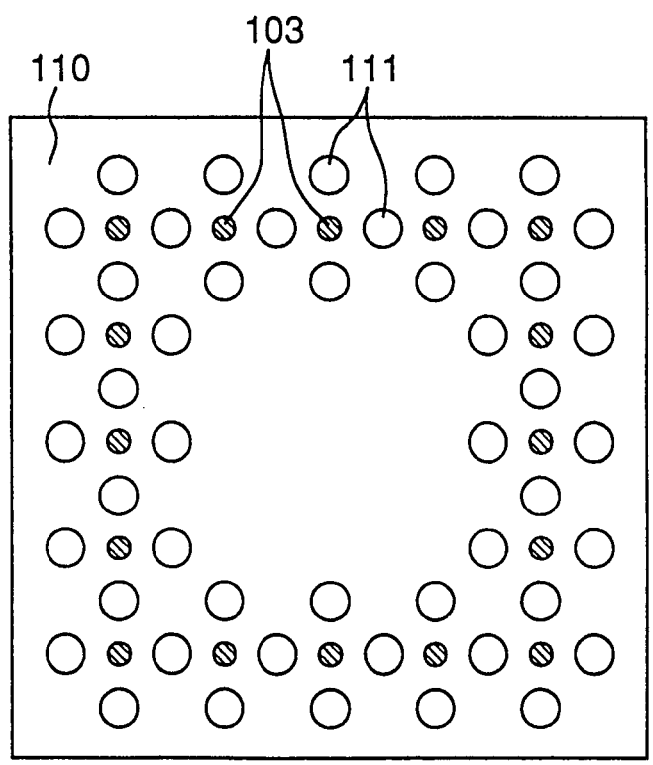
FIG. 14 is a plan view of a first holding plate of a mold used in manufacturing the semiconductor element-mounting board of FIG. 1.

FIG. 14 is a plan view of a first holding plate 110 constituting one wall face of the mold and holding a first axial end of each linear conductive member 103. In FIG. 14, the linear conductive members 103 extend in a direction orthogonal to the drawing sheet. A plurality of injection openings 111 are formed penetrating through the first holding plate 110 in the orthogonal direction so as to inject a fluid resin material 112 into the mold and sets to form the hardened resin 102 of the base member 100. The injection openings 111 are arranged, as is obvious from FIG. 14, symmetrically to each other with respect to each conductive member 103.

Since the injection openings 111 are formed at the above position with respect to the linear conductive member 103, when the fluid resin material 112 flows along the side face of the linear conductive member 103, the linear conductive member 103 is less influenced by a force applied from the fluid resin material 112 in a direction orthogonal to the axial direction. Therefore, the linear conductive members 103 can be enclosed within the base member 100 while maintaining their positional accuracy in the arrangement. In comparison with the case where the fluid resin material 112 is injected into the mold through a single injection opening, a positional shift of the linear conductive member 103 can be limited to 10% or lower. Accordingly, the mounting board 101 can be improved in yield.

Figure 15:
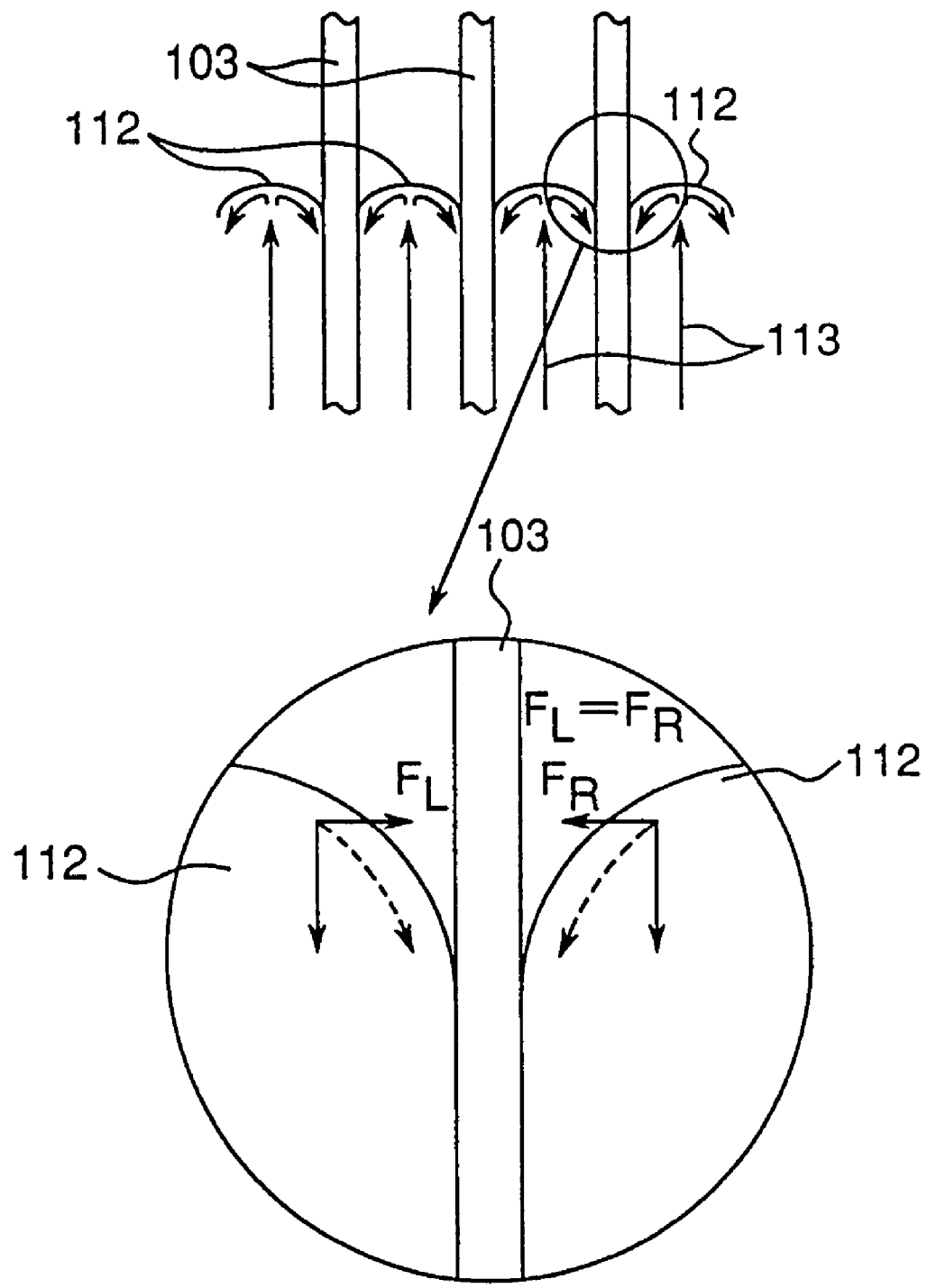
FIG. 15 is a diagram showing how a resin material flows in the mold used in manufacturing the semiconductor element-mounting board of FIG. 1.

FIG. 15 shows the behavior of the fluid resin material 112 flowing in the axial direction in the periphery of the linear conductive members 103. The fluid resin material 112 runs in a direction indicated by arrows 113. The fluid resin material 112 becomes wide in diameter after entering the mold through the injection openings 111, inducing the linear conductive members 103 to be positionally shifted by forces which depend on the viscosity and entering speed of the fluid resin material 112. However, as is clearly shown in FIG. 15, a hydrostatic pressure is impressed uniformly to each of the conductive members 103 from the periphery because the conductive member is free from an extension stress due to a fountain-like flow of the fluid resin material 112. Accordingly, the linear conductive member 103 can be prevented from being positionally shifted even when the fluid resin material 112 enters the mold.

Figure 16:
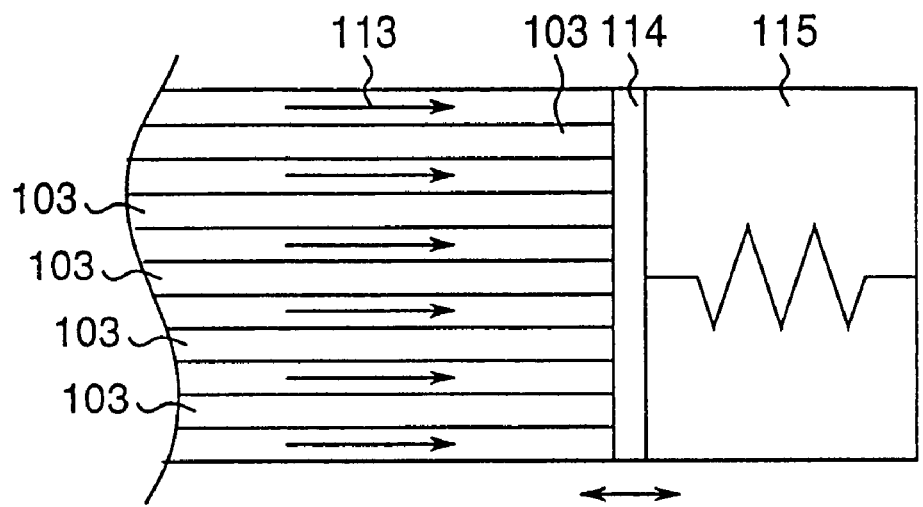
FIG. 16 is a diagram of a second holding plate and a pressure regulation mechanism of the mold used in manufacturing the semiconductor element-mounting board of FIG. 1.

FIG. 16 illustrates a mechanism for more efficiently restricting the positional shift of the conductive member 103 subsequent to the injection of the fluid resin material 112.

Referring to FIG. 16, the other ends of the linear conductive members 103 are held by a second holding plate 114 which constitutes one wall face of the mold and is movable in the axial directions of the conductive members 103. A pressure regulation mechanism 115 is linked to the second holding plate 114, which acts as follows. The pressure regulation on mechanism 115 imparts a tensile force to the conductive members 103, both ends of each of which are held by the first and second holding plates 110, 114. The tensile force prevents each of the linear conductive members 103 from being bent or positionally shifted when the fluid resin material 112 is injected in the mold. More specifically, the pressure regulation mechanism 115 moves the second holding plate 114 in the axial direction of the conductive members 103 in difference between an injection pressure of the regulation mechanism 115. An elastic member such as a spring, a leaf spring, etc. can be used for the pressure regulation mechanism 115, or a compressible fluid. Air is preferable from the economic viewpoint in addition to its easy-to-regulate convenience.

In the presence of the pressure regulation mechanism 115 as described above, when the fluid resin material 112 flowing into the mold from the injection openings 111 applies pressure to the second holding plate 114, the second holding plate 114 is thereby moved to add the tension to the linear conductive members 103. The linear conductive members 103 can be bent less due to this tension. Since the second holding plate 114 is movable, the tension acting on the linear conductive members 103 when the fluid resin material 112 enters the mold can be adjusted, making it possible to increase the injection pressure of the fluid resin material 112.

If a pressuring mechanism for the linear conductive members 103 is fitted to the second holding plate 114, when the conductive members 103 are sequentially sent into the mold and the pressure regulation mechanism 115 is moved stepwise in the right direction of the drawing, the linear conductive members can be sequentially molded to respective predetermined lengths. That is, the linear conductive members can be continuously molded as in hoop molding.

Figure 17:
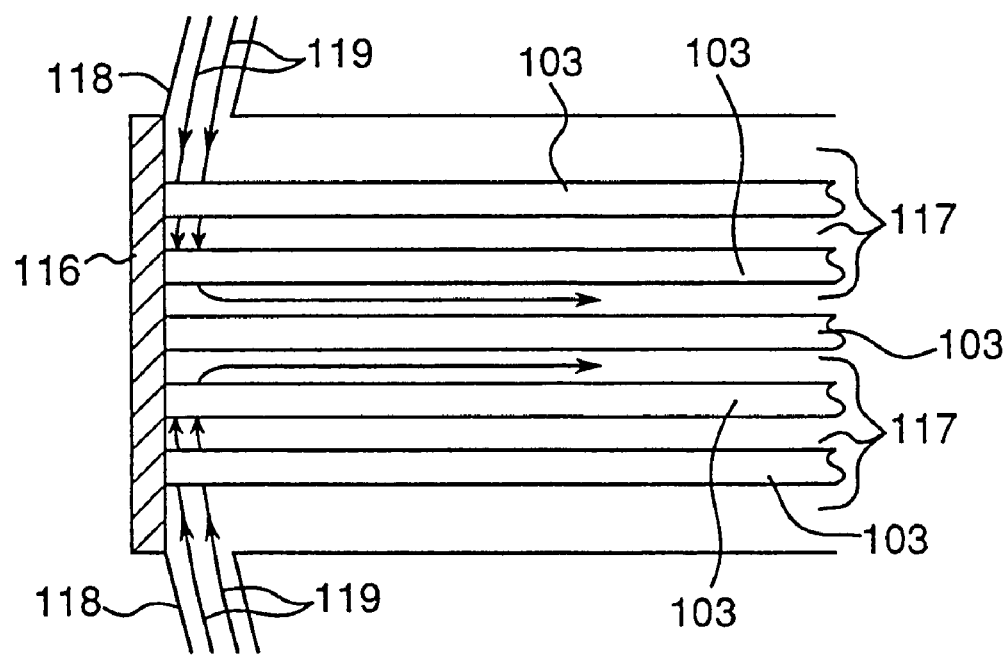
FIG. 17 is a sectional view of a different mold used in manufacturing the semiconductor element-mounting board of FIG. 1.

The structure of another mold will be depicted with reference to FIG. 17.

In comparison with the mold described with reference to FIGS. 14 and 16, the mold of FIG. 17 has injection openings for the fluid resin material 112 at a different position. That is, in the mold in FIG. 17, the injection openings 118 are formed in the vicinity of a third holding plate 116 holding the linear conductive members 103. The injection openings 118 are inclined an angle allowing the fluid resin material 112 to flow towards holding parts between the linear conductive members 103 and third holding plate 116 to a central part of the third holding plate 116. Seen from a plane of the third holding plate 116, at least two injection openings 118 are arranged opposite to each other. The aforementioned angle, location and opening diameter of the injection openings 118 act to reduce the force impressed upon the linear conductive members 103, and the angle depends on a melt viscosity and a solidification speed of the fluid resin material 112.

Due to the injection openings 118 arranged as above, the fluid resin material 112 flows in ways indicated by arrows 119 in FIG. 17 into spaces 117 in the mold. The linear conductive members 103 can be prevented from being positionally shifted by the fluid resin material 112 injected from the direction almost orthogonal to the axial directions of the conductive members 103. This will be proved, for example, from the amount of a bend of a cantilever.

A deflection amount y at a position x from a fixed end of the cantilever is expressed as follows, supposing that a uniform distributed load p is applied to the cantilever:

$$y = px^4/8EI.$$

In this equation, E is Young's modulus and I is a second moment of inertia of the linear conductive member 103. The uniform distributed load p is applied in the form of a drag D to a fluid. D is represented:

$$D = C_D \rho V^2 S/2.$$

In this equation $C_D$ is a drag coefficient of an object and a dimensionless number depending on a shape of the object, $\rho$ is a density of the fluid, V is a velocity of the fluid, and S is a projected area of the conductive member 103 to a face vertical to the flow of the fluid.

The above fluid is namely the fluid resin material 112 and therefore is estimated to have a density of 1. The deflection amount y of the conductive member 103 is accordingly obtained by:

$$y = C_D \rho V^2 S x^4 / 16 EI.$$

The deflection amount of the conductive member 103 can be reduced by directing the fluid, i.e., fluid resin material 112, to the holding part of the conductive member 103 in the vicinity of the third holding plate 116 as much as possible.

The same effect can be accomplished also by reducing a length of the conductive member 103 in the space 117 filled with the fluid resin material 112. Although the foregoing description is related to the cantilever, the same principle is true for a beam with both ends fixed, because the denominator 8 simply changes to 384.

Each amount of the positional shifts of the conductive members when the injection openings 118 are provided as in FIG. 17 and when one injection opening is formed is indicated in Table 2.

TABLE 2

| One injection opening | Embodiment |
| --- | --- |
| 400 μm | 50 μm |

As is clear from Table 2, the shifting amount is favorably decreased in FIG. 17.

The linear conductive members 103 are installed beforehand according to the manufacturing method for the semiconductor element-mounting board 101 which is described referring to FIGS. 7 and 8, in the mold for forming the base member 100 of the mounting board 101 which is described with reference to FIGS. 14–17. As will be described herein below, the mounting board can be manufactured by inserting the conductive members 103 after forming insertion holes for the conductive members 103.

Specifically, columns of a predetermined size are erected in the mold having a space of the required size, or the mold provided with columns of a predetermined size is prepared. Then, the fluid resin material 112 is injected into the spaces in conformity with conditions required for the mounting board. Only the set resin material 102 is taken out from the mold thereafter. The base member with holes is obtained in this manner. Subsequently, conductive members of the same size as the holes are inserted into the holes of the base member or the conductive paste is filled in the holes. The conductive members or conductive paste becomes a path, transmitting electric signals from the semiconductor element-mounting face to the circuit board-mounting face of the mounting board.

Moreover, since the columns for forming the holes are fixed to the mold, the positional shifts brought about in the conventional punching method are eliminated, so that the conduction parts can be defined accurately.

The whole surface of the base member, including inner walls of the holes, are once plated to form conductors. Conductors of an unnecessary part are removed by etching or the like manner, whereby the wiring is obtained.

Plating facilities conventionally used for manufacturing of printed circuit boards is used in the above method, thus requiring no investment in facilities.

Using the mounting board 101, a semiconductor device 130 obtained by mounting/electrically connecting a semiconductor element to the mounting face 104 of the mounting board 101 described above will be depicted with reference to FIGS. 18–20.

Figure 20:
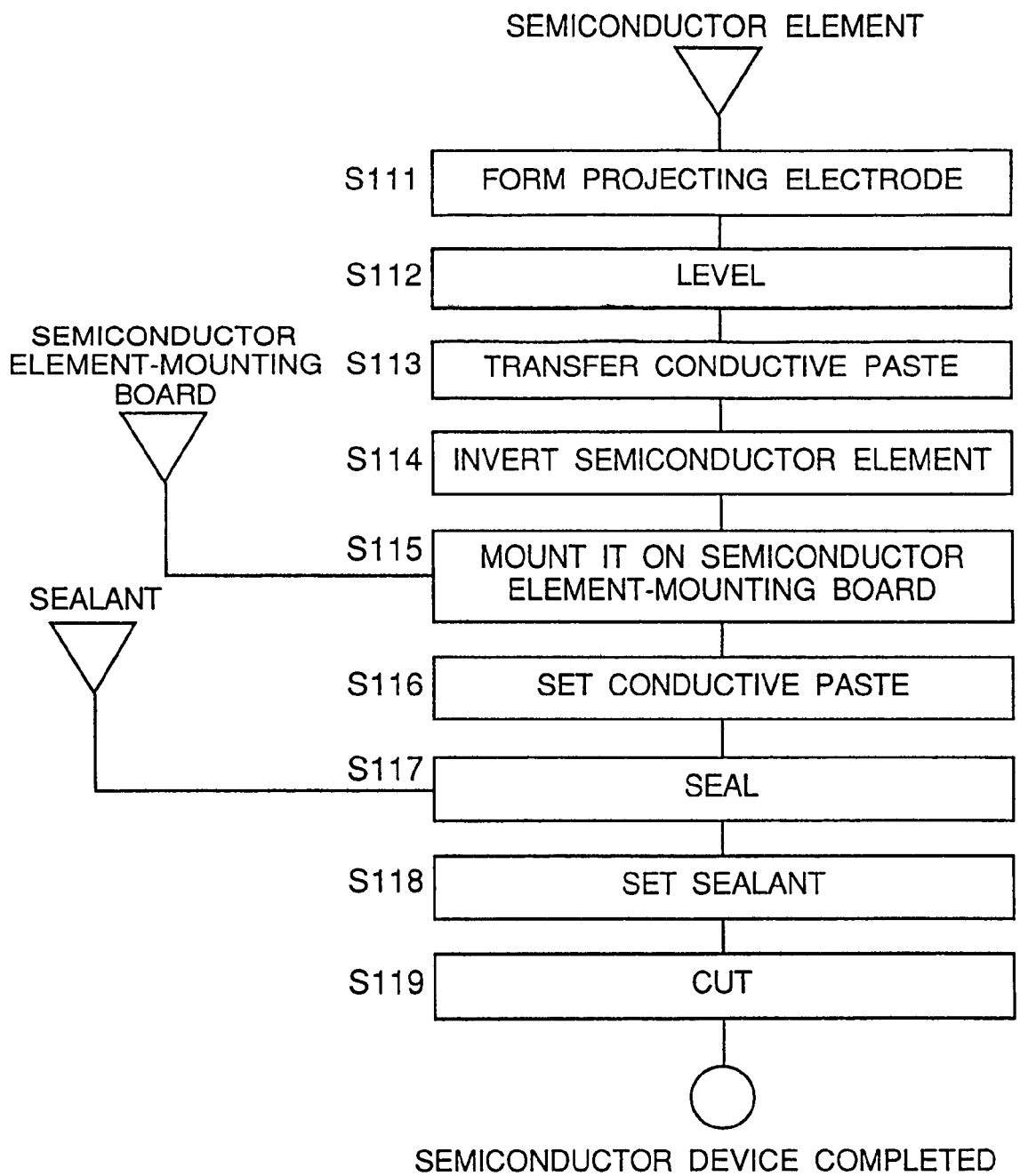
FIG. 20 is a flow chart of a method for manufacturing the semiconductor device of each of FIGS. 18 and 19.

In step 111 of FIG. 20, projecting electrodes 134 are formed on electrode parts 133 at a circuit formation face 132 (i.e., active side) of a semiconductor element 131. Each projecting electrode 134 is made level in step 112, and a conductive paste 135 is transferred to the projecting electrode 134 in step 113. After the transfer of the conductive paste 135, the circuit formation face 132 of the semiconductor element 131 is brought to face the mounting face 104 of the mounting board 101 in step 114.

Figure 18:
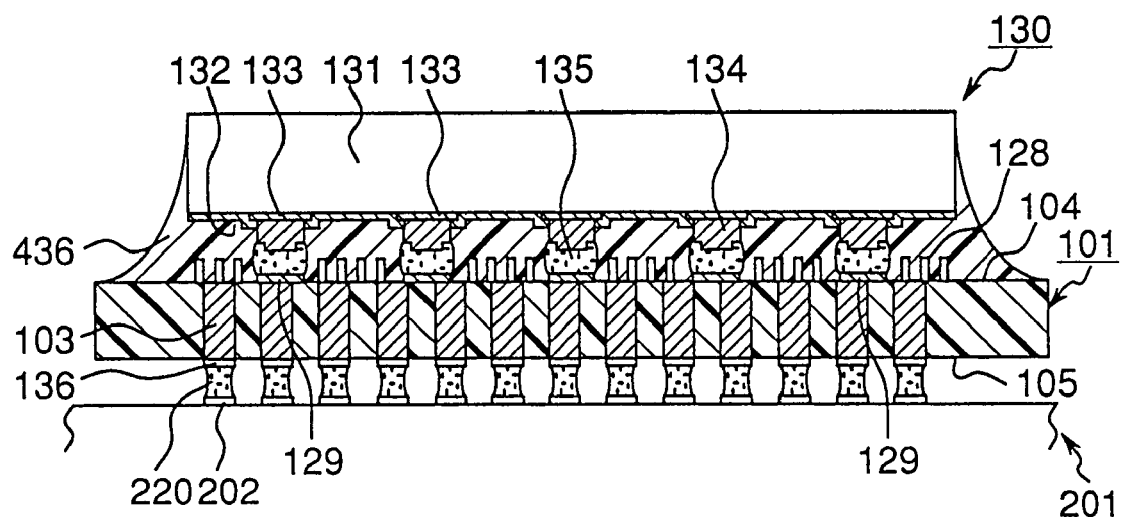
FIG. 18 is a sectional view showing the structure of a semiconductor device according to an embodiment of the present invention.

In the meantime, as shown in FIG. 18, the mounting face 104 of the mounting board 101 is provided with a wiring 128 and lands 129 as described before.

In step 115, the land 129 of the mounting board 101 is electrically connected via the conductive paste 135 to the projecting electrode 134 of the semiconductor element 131. In step 116, the conductive paste 135 is hardened. The semiconductor element 131 is mounted to the mounting face 104 of the mounting board 101. The semiconductor element 131 is sealed at the mounting face 104 by a sealant 436 in step 117. The sealant 436 is set in step 118. If a plurality of semiconductor elements 131 are mounted on the mounting board 101, in step 119, the semiconductor elements 131 are cut and separated from each other in a thicknesswise direction of the mounting board 101. The semiconductor device 130 is completed in this manner. The semiconductor device 130 is mounted to the circuit board 201 as indicated in the drawing by connecting a land 136 on the mounting face 105 of the mounting board 101 with the land 202 of the circuit board 201 via the conductive bonding material 220.

The thus-constituted semiconductor device 130 uses the mounting board 101 manufactured inexpensively with the short lead time as described before. Therefore, the semiconductor device can be obtained at low manufacturing costs with a short lead time.

Mismatching of thermal expansion coefficients of the semiconductor element 131 and circuit board 201 is absorbed by the mounting board 101. Therefore, the semiconductor device has improved bonding reliability to the circuit board as compared with when the semiconductor element is directly mounted to the circuit board.

Although it is difficult to judge a known good die (KGD) if the semiconductor element of a single body is to be judged, the judgement is easily executed by enlarging an electrode pitch of the semiconductor elements via the mounting board 101. In addition, since the mounting board 101 can be manufactured at low cost, losses due to defective semiconductor elements 131 can be limited in the semiconductor device. The mounting board 101 may be used as a socket for the KGD.

According to the present embodiment, the semiconductor element 131 is electrically connected to the mounting board 101 via the projecting electrodes 134 and conductive paste 135. However, the semiconductor element 131 may be electrically connected with the mounting board 101 via a metallic bonding of Au and Au or Au and Sn.

Figure 19:
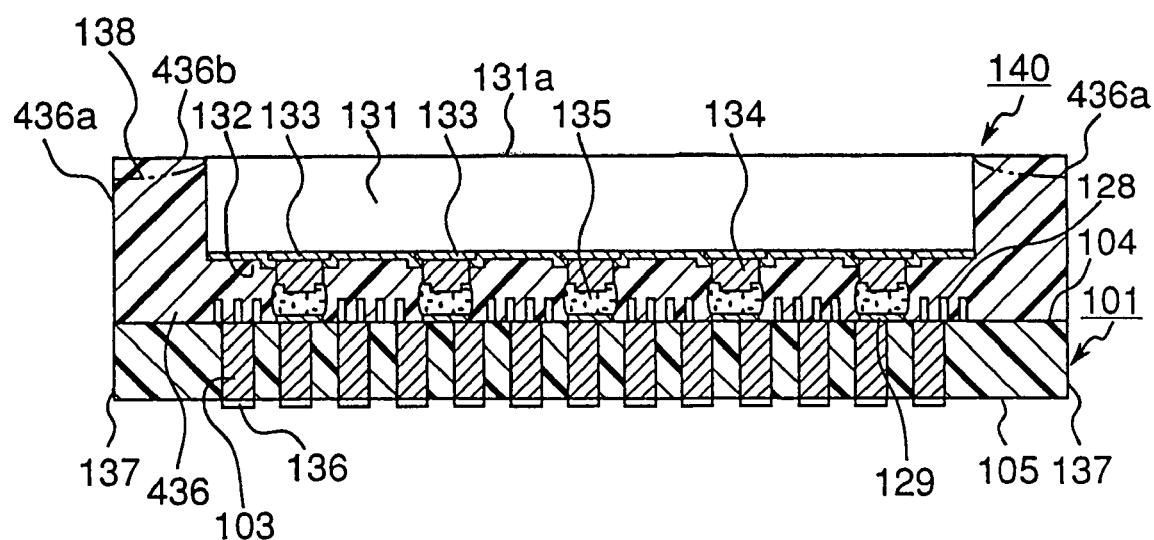
FIG. 19 is a sectional view of a different semiconductor device from FIG. 18.

As shown in FIG. 19, the sealant 436 is preferably injected so that an end face 436a of the sealant 436 is formed along an extension line of a side face 137 of the mounting board 101. When the sealant 436 is injected in this manner, an upper face 436b of the sealant 436 does not need to be even with an upper face 131a of the semiconductor element 131 as indicated by chain double-dashed lines 138, although both faces 436b and 131a are even in FIG. 19.

Since the sealant 436 for protecting the circuit formation face 132 of the semiconductor element 131 is increased in thickness in a semiconductor device 140 of FIG. 19 in comparison within the conventional structure, the semiconductor device 140 is more resistant to the invasion of water. Accordingly, even a device conventionally determined to be defective in the reliability test can be improved in reliability with regard to water to pass the reliability test. The prior art and the embodiment are compared in the PCT, the result of which is shown in Table 3.

TABLE 3

| PCT: 121° C., 2 atm | |
|---|---|
| Prior art | Embodiment |
| 100 hours | 500 hours |

As is fully described above, according to the semiconductor element-mounting board in the first aspect of the present invention and the manufacturing method for the semiconductor element-mounting board in the eight and 17th aspects of the present invention, the base member is constituted by a single layer of the resin material and the conductive members which extend linearly to penetrate the base member of the resin material. The structure is accomplished simply by injecting the resin material into the mold where the conductive members are arranged beforehand. Therefore, the process can be simplified as opposed to the prior art, and can be reduced in cost and lead time so that the productivity can be improved.

Since the conductive members extend linearly in the base member, the conduction resistance can be lower than in the prior art, and the mounting reliability to the circuit board can be improved.

Since the conductive members are set in the base member beforehand, a conventionally required land on the circuit board-mounting face can be eliminated, enabling the arrangement pitch of conductive members to be narrow in comparison with the prior art, which is suitable to multi-pin ICS.

According to the semiconductor device in the 25th aspect of the present invention and the manufacturing method for the semiconductor device in the 27th aspect of the present invention, the above-described semiconductor element-mounting board is used, whereby the manufacturing process can be simplified and reduced in cost and lead time, with productivity improved. The present invention can be used with multi-pin ICS and improve mounting reliability onto the circuit board.

The entire disclosure of Japanese Patent Application No. 8-179031 filed on Jul. 9, 1996, including specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skills in the art. Such changes and modifications are to be understood as included within the scope of the present invention as defined by the appended claims unless they depart therefrom.

What is claimed is:

1. A method of manufacturing a semiconductor element-mounting board, comprising:
arranging a plurality of conductive members in a mold;
injecting an electrically insulating resin material into the mold after the conductive members are arranged therein so that the conductive members and the resin material are integrally molded to form a base member having a semiconductor element-mounting face and a circuit board-mounting face opposite the semiconductor element-mounting face, said arranging of the conductive members comprising orienting the conductive members in the mold so that the conductive members are substantially orthogonal to the semiconductor element-mounting face and the circuit board-mounting face and extend linearly through an interior of the base member between the semiconductor element-mounting face and the circuit board-mounting face, said injecting comprising injecting the resin material in an axial direction parallel to the longitudinal axes of the conductive members through at least two injection openings arranged symmetrically around each of the conductive members;
mounting and electrically connecting a semiconductor element to the semiconductor element-mounting face by flip-chip mounting; and
mounting and electrically connecting the circuit board-mounting face to a circuit board.

2. The method of claim 1, wherein said injecting comprises injecting the resin material in an axial direction parallel to the longitudinal axes of the conductive members through the injection openings formed in an end of the mold closest to and supporting a first end of each of the conductive members.

3. A method of manufacturing a semiconductor element-mounting board, comprising:
arranging a plurality of conductive members in a mold;
injecting an electrically insulating resin material into the mold after the conductive members are arranged therein so that the conductive members and the resin material are integrally molded to form a base member having a semiconductor element-mounting face and a circuit board-mounting face opposite the semiconductor element-mounting face, said arranging of the conductive members comprising orienting the conductive members in the mold so that the conductive members are substantially orthogonal to the semiconductor element-mounting face and the circuit board-mounting face and extend linearly through an interior of the base member between the semiconductor element-mounting face and the circuit board-mounting face, said injecting comprising injecting the resin material in an axial direction parallel to the longitudinal axes of the conductive members through at least two injection openings arranged symmetrically with respect to the conductive members, wherein the mold includes a first holding plate for holding a first axial end of each of the conductive members, the injection openings being formed in the first holding plate, includes a second holding plate for holding a second axial end of each of the conductive members and being operable to move in the axial direction, and includes a pressure regulation mechanism for biasing the second holding plate in the axial direction in response to a compression or extension of the conductive members due to said injection of the resin material;
during said injecting of the resin material, moving the second holding plate in the axial direction using the pressure regulation mechanism in response to the compression/extension of the conductive members due to said injection of the resin material, thereby restricting bends in the conductive members;
mounting and electrically connecting a semiconductor element to the semiconductor element-mounting face by flip-chip mounting; and mounting and electrically connecting the circuit board-mounting face to a circuit board.

4. A method of manufacturing a semiconductor element-mounting board, comprising:

arranging a plurality of conductive members in a mold;

injecting an electrically insulating resin material into the mold after the conductive members are arranged therein so that the conductive members and the resin material are integrally molded to form a base member having a semiconductor element-mounting face and a circuit board-mounting face opposite the semiconductor element-mounting face, said arranging of the conductive members comprising orienting the conductive members in the mold so that the conductive members are substantially orthogonal to the semiconductor element-mounting face and the circuit board-mounting face and extend linearly through an interior of the base member between the semiconductor element-mounting face and the circuit board-mounting face;

after said injecting of the resin material, forming a projecting portion of the conductive member projecting from the circuit board-mounting face of the base member, said forming of the projecting portion including:

leveling the base member including the conductive members so that a thickness of the base member is equal to a length of each of the conductive members; and after said leveling, removing only a portion of the resin material of the base member in a thickness direction of base member;

plastically deforming the projecting portion so as to form a land to be connected to a circuit board;

mounting and electrically connecting a semiconductor element to the semiconductor element-mounting face by flip-chip mounting; and mounting and electrically connecting the circuit board-mounting face to a circuit board.

5. The method of claim 4, wherein said removing of the portion of the resin material comprises one of wet etching, dry etching, sandblasting, and machining.

* * * * *